(12) United States Patent
Hu et al.

(10) Patent No.: US 12,733,338 B2
(45) Date of Patent: Sep. 8, 2026

(54) DISPLAY PANEL, MANUFACTURING METHOD THEREOF, AND DISPLAY APPARATUS

(71) Applicants: MIANYANG BOE OPTOELECTRONICS TECHNOLOGY CO., Ltd., Mianyang (CN); BOE Technology Group Co., Ltd., Beijing (CN)

(72) Inventors: Yong Hu, Beijing (CN); Zerui Zhang, Beijing (CN); Dali Li, Beijing (CN)

(73) Assignees: MIANYANG BOE OPTOELECTRONICS TECHNOLOGY CO., Ltd., Mianyang (CN); BOE Technology Group Co., Ltd., Beijing (CN)

( * ) Notice: Subject to any disclaimer, the term of this patent is extended or adjusted under 35 U.S.C. 154(b) by 539 days.

(21) Appl. No.: 17/777,820

(22) PCT Filed: Mar. 22, 2021

(86) PCT No.: PCT/CN2021/082203
§ 371 (c)(1),
(2) Date: Feb. 21, 2024

(87) PCT Pub. No.: WO2022/193332
PCT Pub. Date: Sep. 22, 2022

(65) Prior Publication Data

US 2024/0237483 A1 Jul. 11, 2024

(30) Foreign Application Priority Data

Mar. 15, 2021 (WO) ................ PCT/CN2021/080752

(51) Int. Cl.
*H10K 59/121* (2023.01)
*H10K 59/12* (2023.01)
(Continued)

(52) U.S. Cl.
CPC ....... *H10K 59/121* (2023.02); *H10K 59/1201* (2023.02); *H10K 59/40* (2023.02);
(Continued)

(58) Field of Classification Search
CPC ... H10K 59/1201; H10K 59/121; H10D 84/01
See application file for complete search history.

(56) References Cited

U.S. PATENT DOCUMENTS

2019/0179466 A1 6/2019 Kim et al.
2019/0181373 A1 6/2019 Kim
(Continued)

FOREIGN PATENT DOCUMENTS

CN 110021635 A 7/2019
CN 110265583 A 9/2019
(Continued)

OTHER PUBLICATIONS

U.S. Appl. No. 17/756,329 non-final office action dated Nov. 27, 2024.

(Continued)

*Primary Examiner* — Marlon T Fletcher
*Assistant Examiner* — Samuel Jonathan Smith
(74) *Attorney, Agent, or Firm* — IPro, PLLC

(57) ABSTRACT

The present disclosure provides a display panel, a manufacturing method thereof, and a display apparatus. The display panel includes a display area, provided with at least one to-be-dug area; and an annular isolation area, surrounding the to-be-dug area, and arranged between the to-be-dug area and the display area surrounding the to-be-dug area, the annular isolation area includes a first annular blocking dam surrounding the to-be-dug area. The display panel includes: a base substrate, an electroluminescent layer, an encapsulation layer and a filling layer. An orthographic projection of the filling layer on the base substrate is within a range of
(Continued)

orthographic projections of the to-be-dug area and the annular isolation area on the base substrate.

20 Claims, 12 Drawing Sheets

(51) Int. Cl.
*H10K 59/40* (2023.01)
*H10K 59/80* (2023.01)
*H10K 59/65* (2023.01)
*H10K 102/00* (2023.01)

(52) U.S. Cl.
CPC ....... *H10K 59/873* (2023.02); *H10K 59/8731* (2023.02); *H10K 59/65* (2023.02); *H10K 59/80* (2023.02); *H10K 59/875* (2023.02); *H10K 2102/351* (2023.02)

(56) References Cited

U.S. PATENT DOCUMENTS

| | | | |
|---|---|---|---|
| 2020/0235333 | A1 | 7/2020 | Sung et al. |
| 2020/0303677 | A1 | 9/2020 | Lee et al. |
| 2020/0411629 | A1 | 12/2020 | Kim et al. |
| 2021/0028249 | A1 | 1/2021 | Ding et al. |
| 2021/0408150 | A1 | 12/2021 | Zhang et al. |
| 2022/0006048 | A1 | 1/2022 | Chien |
| 2022/0020946 | A1 | 1/2022 | Zhang et al. |
| 2022/0029137 | A1 | 1/2022 | Ko et al. |
| 2022/0077438 | A1 | 3/2022 | Wang et al. |
| 2022/0130937 | A1 | 4/2022 | Zhao et al. |
| 2022/0199952 | A1 | 6/2022 | Jang et al. |

FOREIGN PATENT DOCUMENTS

| | | | | | |
|---|---|---|---|---|---|
| CN | 110854304 | A | * | 2/2020 | ........... H10K 59/124 |
| CN | 210377421 | U | | 4/2020 | |
| CN | 111162195 | A | * | 5/2020 | ............ H10K 59/65 |
| CN | 111211245 | A | | 5/2020 | |
| CN | 210516729 | U | | 5/2020 | |
| CN | 111244112 | A | | 6/2020 | |
| CN | 111384069 | A | | 7/2020 | |
| CN | 111463236 | A | | 7/2020 | |
| CN | 111525044 | A | | 8/2020 | |
| CN | 111725257 | A | | 9/2020 | |
| CN | 111740028 | A | | 10/2020 | |
| CN | 111900260 | A | | 11/2020 | |
| CN | 112271199 | A | | 1/2021 | |
| CN | 112349867 | A | | 2/2021 | |
| EP | 3276463 | A1 | | 1/2018 | |
| JP | 2022096631 | A | | 6/2022 | |

OTHER PUBLICATIONS

U.S. Appl. No. 17/756,329 Final Rejection dated Mar. 24, 2025.
CN202180000491.8 first office action.

* cited by examiner d1
132
127
126
c1
d2
VA1
c2
AA
133
131
126
124
126
122
134
132
13
127
125
123
121
10
11
12

DISPLAY PANEL, MANUFACTURING METHOD THEREOF, AND DISPLAY APPARATUS

CROSS REFERENCE TO RELATED APPLICATIONS

The present disclosure is a National Stage of International Application No. PCT/CN2021/082203, filed Mar. 22, 2021, which claims the priority from an International Application No. PCT/CN2021/080752, filed on Mar. 15, 2021, and entitled "Display Panel, Manufacturing Method thereof, and Display Apparatus", of which the entire contents are incorporated herein by reference.

FIELD

The present disclosure relates to the technical field of display, in particular to a display panel, a manufacturing method thereof, and a display apparatus.

BACKGROUND

In recent years, with continuous development of a display technology, in order to increase a screen-to-body ratio of a display screen, a functional device is usually not disposed at an edge of the display screen, but the entire surface of the display screen is disposed as a display area, and a hole is dug in the screen to install the corresponding functional device. However, a film layer at a hole digging position is relatively weaker than other areas. Therefore, when the display screen is peeled or bent, the film layer at the hole digging position is likely to be re-separated, resulting in a phenomenon of rainbow patterns.

SUMMARY

A first aspect of an embodiment of the present disclosure provides a manufacturing method of a display panel, the display panel includes a display area, at least one to-be-dug area surrounded by the display area, and an annular isolation area arranged between the to-be-dug area and the display area: and the manufacturing method includes:

forming an annular blocking dam surrounding the to-be-dug area in the annular isolation area on a base substrate;

forming an electroluminescent layer on the base substrate and the annular blocking dam;

forming an encapsulation layer on a side, facing away from the base substrate, of the electroluminescent layer; and forming a filling layer on a side, facing away from the electroluminescent layer, of the encapsulation layer in the to-be-dug area and a side, facing away from the electroluminescent layer, of the annular isolation area, the encapsulation layer includes a first inorganic encapsulation layer, a second inorganic encapsulation layer, and an organic encapsulation layer disposed in a lamination mode; the organic encapsulation layer includes a first organic encapsulation part and a second organic encapsulation part, the first organic encapsulation part covers the to-be-dug area, and is arranged between the first inorganic encapsulation layer and the second inorganic encapsulation layer corresponding to the to-be-dug area: and the second organic encapsulation layer covers the display area, and is arranged between the first inorganic encapsulation layer and the second inorganic encapsulation layer corresponding to the display area.

In some embodiments of the present disclosure, a thickness of the first organic encapsulation part is smaller than a thickness of the annular blocking dam.

In some embodiments of the present disclosure, the organic encapsulation layer is manufactured by an inkjet printing method.

In some embodiments of the present disclosure, before forming the annular blocking dam, the manufacturing method further includes:

forming a flexible substrate on the base substrate; and the forming the annular blocking dam on the base substrate includes:

forming the annular blocking dam while forming a driving circuit layer on a side, facing away from the base substrate, of the flexible substrate.

In some embodiments of the present disclosure, the forming the annular blocking dam while forming the driving circuit layer on the side, facing away from the base substrate of the flexible substrate, includes:

forming a first annular blocking dam surrounding the to-be-dug area, a second annular blocking dam surrounding the first annular blocking dam, and a plurality of annular isolation parts arranged between the first annular blocking dam and the second annular blocking dam, in the annular isolation area on the side, facing away from the base substrate, of the flexible substrate;

the plurality of annular isolation parts surround the second annular blocking dam.

In some embodiments of the present disclosure, the forming the driving circuit layer on the side, facing away from the base substrate, of the flexible substrate, includes:

forming a buffer layer on the base substrate;

forming a pattern of an active layer on a side, facing away from the base substrate, of the buffer layer;

forming a gate insulating layer on a side, facing away from the buffer layer, of the active layer;

forming a pattern of a gate metal layer on a side, facing away from the active layer, of the gate insulating layer;

forming an interlayer insulating layer on a side, facing away from the gate insulating layer, of the gate metal layer;

forming a pattern of a source-drain metal layer on a side, facing away from the gate metal layer, of the interlayer insulating layer: and forming a planarization layer on a side, facing away from the interlayer insulating layer, of the source-drain metal layer.

In some embodiments of the present disclosure, the annular isolation part is an annular isolation spacer, and the method further includes:

forming the annular isolation spacer while forming the pattern of the source-drain metal layer.

In some embodiments of the present disclosure, the annular isolation part is an annular isolation groove, and the method further includes:

forming the annular isolation groove by etching the flexible substrate, the buffer layer, the gate insulating layer and the interlayer insulating layer formed in the annular isolation area.

In some embodiments of the present disclosure, the forming the electroluminescent layer on the base substrate and the annular blocking dam includes:

forming a pattern of a first electrode layer on a side, facing away from the source-drain metal layer, of the planarization layer;

forming a pattern of a pixel defining layer on a side, facing away from the source-drain metal layer, of the planarization layer;

forming a pattern of a supporting part on a side, facing away from the planarization layer, of the pixel defining layer;

forming a light-emitting layer on a side, facing away from the planarization layer, of the first electrode layer: and forming a second electrode layer on a side, facing away from the first electrode layer, of the light-emitting layer, an orthographic projection of the pattern of the pixel defining layer on the base substrate partially overlaps with an orthographic projection of the pattern of the first electrode layer on the base substrate: and the first annular blocking dam and the second annular blocking dam are in a same layer as at least one of the planarization layer, the pixel defining layer or the supporting part.

In some embodiments of the present disclosure, an orthographic projection of the filling layer on the base substrate has an overlapped area with an orthographic projection of the second organic encapsulation part on the base substrate.

In some embodiments of the present disclosure, the second organic encapsulation part covers the second annular isolation spacer and a side wall of a side, facing away from the first annular blocking dam, of the second annular blocking dam.

In some embodiments of the present disclosure, a surface of a side, facing away from the base substrate, of the filling layer is higher than a surface of a side, facing away from the base substrate, of the encapsulation layer in the display area.

In some embodiments of the present disclosure, the manufacturing method further includes:

forming a blocking layer on a side, facing away from the base substrate, of the filling layer and a side facing away from the base substrate, of the encapsulation layer;

forming a touch functional layer on a side, facing away from the base substrate, of the blocking layer: and forming a protective layer on a side, facing away from the blocking layer, of the touch functional layer, the touch functional layer includes a pattern of a touch electrode, and an orthographic projection of the pattern of the touch electrode on the base substrate does not overlap with an orthographic projection of the filling layer on the base substrate.

In some embodiments of the present disclosure, the forming the touch functional layer on the side, facing away from the base substrate, of the blocking layer, includes:

forming a first metal layer on a side, facing away from the base substrate, of the blocking layer;

forming a touch insulating layer on a side, facing away from the blocking layer, of the first metal layer: and forming a second metal layer on a side, facing away from the first metal layer, of the touch insulating layer, the first metal layer includes a pattern of a first touch electrode connection part, and the second metal layer includes a pattern of a first touch electrode, a pattern of a second touch electrode and a pattern of a second touch electrode connection part: and an orthographic projection of the first touch electrode connection part on the base substrate does not overlap with the orthographic projection of the filling layer on the base substrate.

In some embodiments of the present disclosure, the manufacturing method further includes:

peeling the flexible substrate from the base substrate; and digging a hole on the to-be-dug area in the display panel.

A second aspect of an embodiment of the present disclosure provides a display panel, manufactured by adopting any of the above manufacturing method:

the display panel includes:

a flexible substrate, comprising a display area, at least one to-be-dug area surrounded by the display area, and an annular isolation area arranged between the display area and the to-be-dug area;

a driving circuit layer, disposed on the flexible substrate;

an electroluminescent layer, disposed on a side, facing away from the flexible substrate, of the driving circuit layer;

an encapsulation layer, disposed on a side, facing away from the flexible substrate, of the electroluminescent layer;

a filling layer, disposed on a side, facing away from the electroluminescent layer, of the encapsulation layer, the filling layer is in the annular isolation area;

a blocking layer, disposed on a side, facing away from the electroluminescent layer, of the encapsulation layer and a side facing away from the electroluminescent layer, of the filling layer; and a touch functional layer, disposed on a side, facing away from the encapsulation layer, of the blocking layer, a surface of a side, facing away from the flexible substrate, of the filling layer is higher than a surface of a side, facing away from the flexible substrate, of the encapsulation layer in the display area; and the touch functional layer includes a pattern of a touch electrode, and an orthographic projection of the pattern of the touch electrode on the flexible substrate does not overlap with an orthographic projection of the filling layer on the flexible substrate.

In some embodiments of the present disclosure, the display panel further includes:

a protective layer, disposed on a side, facing away from the encapsulation layer, of the touch functional layer and a side facing away from the encapsulation layer, of the blocking layer, the driving circuit layer includes:

a buffer layer, disposed on the flexible substrate;

an active layer, disposed on a side, facing away from the flexible substrate, of the buffer layer;

a gate insulating layer, disposed on a side, facing away from the flexible substrate, of the active layer and a side, facing away from the flexible substrate, of the buffer layer;

a gate metal layer, disposed on a side, facing away from the active layer, of the gate insulating layer;

an interlayer insulating layer, disposed on a side, facing away from the gate insulating layer, of the gate metal layer;

a source-drain metal layer, disposed on a side, facing away from the gate metal layer, of the interlayer insulating layer; and a planarization layer, disposed on a side, facing away from the interlayer insulating layer, of the source-drain metal layer;

the electroluminescent layer includes:

a first electrode layer, disposed on a side, facing away from the source-drain metal layer, of the planarization layer, the first electrode layer includes a plurality of first electrodes;

a pixel defining layer, disposed on a side, facing away from the source-drain metal layer, of the planarization layer, the pixel defining layer located at a spacing position between adjacent first electrodes;

a supporting part, disposed on a side, facing away from the planarization layer, of the pixel defining layer;

a light-emitting layer, disposed on a side, facing away from the planarization layer, of the first electrodes: and a second electrode layer, disposed on a side, facing away from the first electrode layer, of the light-emitting layer and a side, facing away from the first electrode layer, of the pixel defining layer;

the encapsulation layer includes:

a first inorganic encapsulation layer, disposed on a side, facing away from the light-emitting layer, of the second electrode layer;

an organic encapsulation layer, disposed on a side, facing away from the second electrode layer, of the first inorganic encapsulation layer;

a second inorganic encapsulation layer, disposed on a side, facing away from the first encapsulation layer, of the organic encapsulation layer, orthographic projections of the first inorganic encapsulation layer and the second inorganic encapsulation layer on the flexible substrate cover the display area and the annular isolation area: and an orthographic projection of the organic encapsulation layer on the flexible substrate is in the display area: and the touch functional layer includes:

a first metal layer, disposed on a side, facing away from the encapsulation layer, of the blocking layer;

a touch insulating layer, disposed on a side, facing away from the blocking layer, of the first metal layer; and a second metal layer, disposed on a side, facing away from the first metal layer, of the touch insulating layer, the first metal layer includes a pattern of a first touch electrode connection part, the second metal layer includes a pattern of a first touch electrode, a pattern of a second touch electrode and a pattern of a second touch electrode connection part, and the first touch electrode connection part is electrically connected with the first touch electrode through a via hole of the touch insulating layer: and an orthographic projection of the pattern of the first touch electrode connection part on the flexible substrate does not overlap with the orthographic projection of the filling layer on the flexible substrate.

In some embodiments of the present disclosure, the annular isolation area includes:

an annular blocking dam, surrounding the to-be-dug area;

at least one first annular isolation part, surrounded by the annular blocking dam; and at least one second annular isolation part, surrounding the annular blocking dam, the annular blocking dam is in a same layer as at least one of the planarization layer, the pixel defining layer or a supporting post.

In some embodiments of the present disclosure, the organic encapsulation layer covers second annular isolation part and a side wall of a side, facing the display area, of the annular blocking dam.

In some embodiments of the present disclosure, the orthographic projection of the filling layer on the flexible substrate has an overlap area with the orthographic projection of the organic encapsulation layer on the flexible substrate.

In some embodiments of the present disclosure, the filling layer covers the annular blocking dam, and an edge close to the display area, of the filling layer does not exceed an edge closest to the display area, of the second annular isolation part.

In some embodiments of the present disclosure, the first annular isolation part and the second annular isolation part are both annular isolation spacers: and the annular isolation spacer and the source-drain metal layer are disposed on a same layer.

In some embodiments of the present disclosure, the first annular isolation part and the second annular isolation part are both annular isolation grooves: and the annular isolation grooves penetrate through the buffer layer, the gate insulating layer and the interlayer insulating layer, to form the annular isolation grooves on the flexible substrate.

A third aspect of an embodiment of the present disclosure provides a display apparatus, including the above display panel.

BRIEF DESCRIPTION OF THE DRAWINGS

In order to illustrate the technical solution of the embodiments of the present disclosure more clearly, drawings needing to be used in the embodiments of the present disclosure will be introduced below briefly. Obviously, the drawings introduced below are only some embodiments of the present disclosure, those skilled in the art can further obtain other drawings according to these drawings without inventive efforts.

DETAILED DESCRIPTION OF THE EMBODIMENTS

Figure 1:
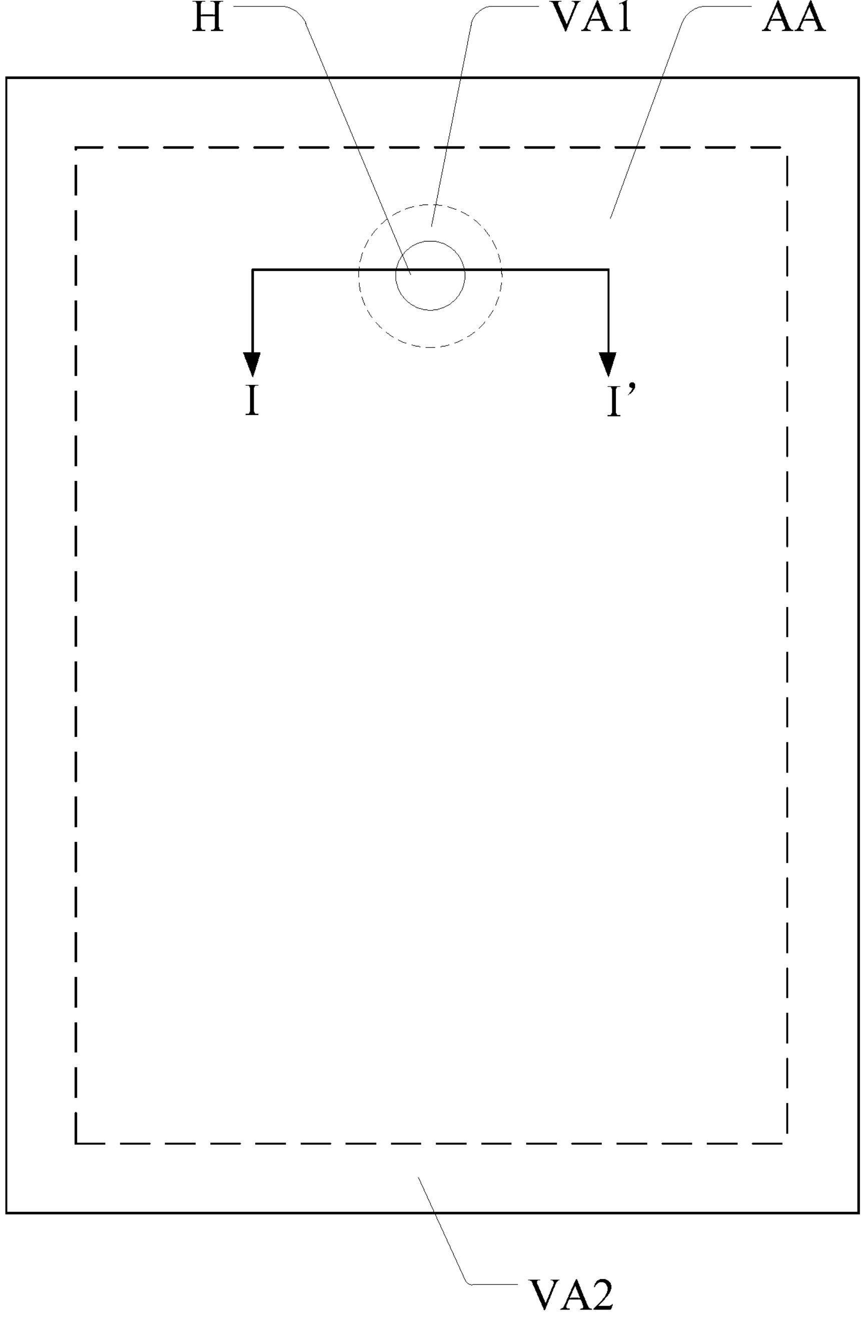
FIG. 1 is a schematic diagram of a plane structure of a display panel provided by an embodiment of the present disclosure.

In order to make the above objects, features and advantages of the present disclosure more clearly understood, the present disclosure will be further described below with reference to accompanying drawings and embodiments. However, exemplary implementation may be implemented in various forms and should not be construed as limited to the embodiments set forth herein: rather, these implementations are provided so that the present disclosure will be thorough and complete, and the concept of the exemplary implementation is fully conveyed to the skilled in the art. The same reference numerals in the accompanying drawings denote the same or similar structures, and thus their repeated descriptions will be omitted. The words expressing position and direction described in the present disclosure are all described by taking the accompanying drawings as an example, but changes may also be made as required, and the made changes are all contained in the protection scope of the present disclosure. The accompanying drawings of the present disclosure are only configured to illustrate a relative positional relationship and do not represent actual scales.

With development of a display technology, an Organic Light-emitted Diode (OLED for short) display technology has shown great potential. The excellent display performance of the OLED makes it have an extensive application space. At the same time, an OLED display panel has the characteristic of self-luminescence, and thus is more suitable to be manufactured into a flexible display screen. Compared with a conventional display screen, the flexible display screen has the characteristics of being bendable and good in flexibility, which improves portability of a display device.

The flexible display screen is usually manufactured on a rigid substrate, and then the flexible display screen is peeled from the rigid substrate. In order to improve a screen-to-body ratio of the display screen, the current display screen will dig holes in the screen to install functional devices. Since a film layer at a hole digging position is relatively weaker than other areas, when the display screen is peeled or bent, the film layer at the hole digging position is likely to be re-separated, resulting in a phenomenon of rainbow patterns.

In view of this, an embodiment of the present disclosure provides a manufacturing method of a display panel. FIG. 1 is a schematic diagram of a plane structure of the display panel provided by embodiments of the present disclosure.

As shown in FIG. 1, the display panel may include: a display area AA, a to-be-dug area H, an annular isolation area VA1 and a peripheral area VA2.

The display area AA occupies most of the display panel and is used for image display; the peripheral area VA2 surrounds the display area AA, and is used for wiring and connecting driving elements.

As shown in FIG. 1, the display area AA is provided with at least one to-be-dug area H, and the to-be-dug area H will be subjected to hole digging treatment after the display panel is manufactured, so that the display panel forms a through hole in the display area AA.

The through hole formed in the display panel is configured to set at least one of an image collecting structure, a camera, an earpiece, or a light sensor.

The annular isolation area VA1 is arranged between the hole digging area H and the display area AA surrounding the to-be-dug area H. The annular isolation area VA1 surrounds the to-be-dug area H, and plays a role in isolating the display area AA at the hole digging position.

Figure 2:
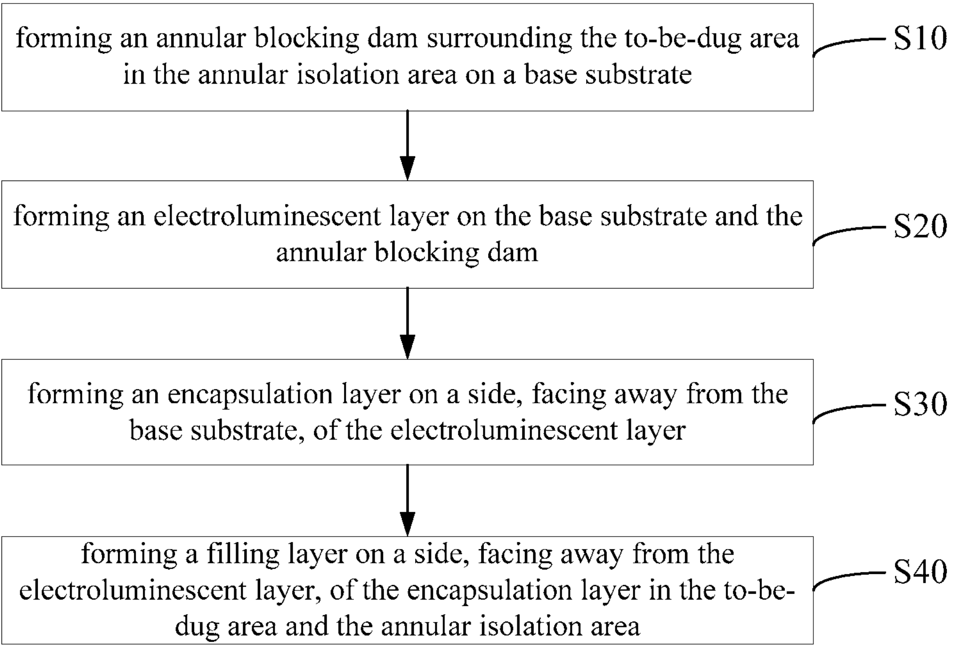
FIG. 2 is a flow diagram of a manufacturing method of a display panel provided by an embodiment of the present disclosure.

FIG. 2 is a flow diagram of the manufacturing method of the display panel provided by the embodiment of the present disclosure.

As shown in FIG. 2, the manufacturing method of the display panel provided by an embodiment of the present disclosure includes:

S10, an annular blocking dam surrounding a to-be-dug area is formed in an annular isolation area on a base substrate;

S20, an electroluminescent layer is formed on the base substrate and the annular blocking dam;

S30, an encapsulation layer is formed on a side, facing away from the base substrate, of the electroluminescent layer: and S40, a filling layer is formed on a side, facing away from the electroluminescent layer, of the encapsulation layer in the to-be-dug area and a side, facing away from the electroluminescent layer, of the annular isolation area.

The encapsulation layer includes a first inorganic encapsulation layer, a second inorganic encapsulation layer, and an organic encapsulation layer disposed in a lamination mode; the organic encapsulation layer includes a first organic encapsulation part and a second organic encapsulation part, the first organic encapsulation part covers the to-be-dug area, and is arranged between the first inorganic encapsulation layer and the second inorganic encapsulation layer corresponding to the to-be-dug area: and the second organic encapsulation layer covers the display area, and is arranged between the first inorganic encapsulation layer and the second inorganic encapsulation layer corresponding to the display area.

The display panel provided by embodiments of the present disclosure may be a flexible display panel. Therefore, before the forming the first annular blocking dam, the manufacturing method further includes: a flexible substrate is formed on the base substrate.

In addition, after forming the flexible substrate on the base substrate, and before forming the electroluminescent layer, the manufacturing method further includes: a driving circuit layer is formed on a side, facing away from the base substrate, of the flexible substrate, and an annular blocking dam is formed on a side, facing away from the base substrate, of the flexible substrate.

Figure 3:
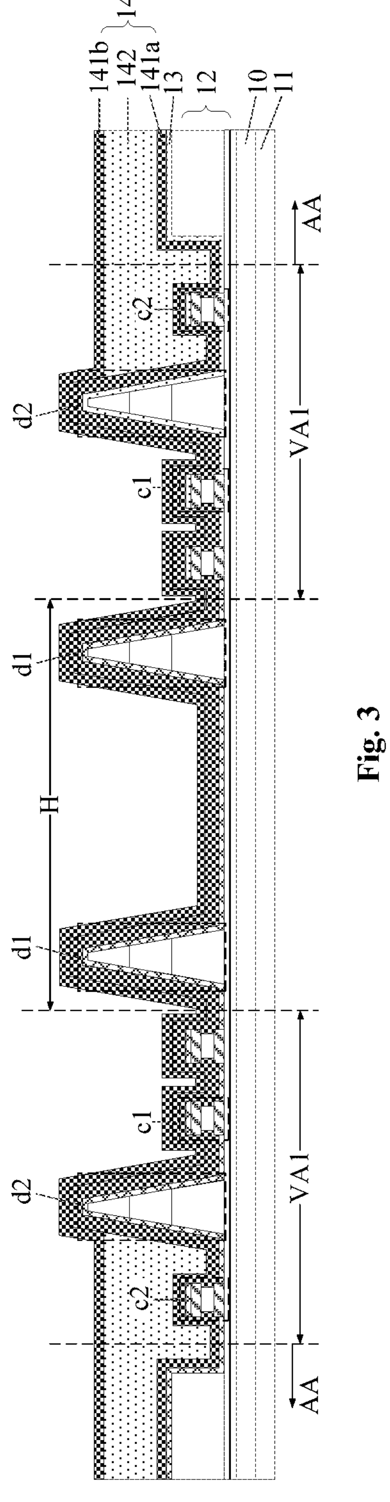
FIG. 3 is a schematic diagram of a section structure of an area I-I' in FIG. 1.

FIG. 3 is a schematic diagram of a section structure of an area I-I' in FIG. 1.

As shown in FIG. 3, a display panel manufactured by adopting the manufacturing method of the display panel provided by embodiments of the present disclosure includes: a base substrate 11, a driving circuit layer 12, an electroluminescent layer 13 and an encapsulation layer 14.

The base substrate 11 is arranged at the bottom of the display panel and has the function of supporting and carrying. The base substrate 11 may adopt a glass substrate or the like, which is not limited here.

When manufacturing a flexible display panel, a layer of flexible substrate 10 is disposed on the base substrate 11 to serve as a substrate of the flexible display panel. At this time, the base substrate 11 plays a role in supporting in a manufacturing process. After the display panel is manufactured, the flexible substrate 10) and the base substrate 11 are peeled to obtain the flexible display panel.

The driving circuit layer 12 is disposed on the base substrate 11. The driving circuit layer 12 includes a plurality of metal layers and a plurality of insulating layers, and each metal layer includes a set pattern, thereby forming a Thin Film Transistor (TFT for short) capacitors, resistors, signal lines and other structures for driving the electroluminescent layer 13 to emit light.

Since the to-be-dug area H will eventually be excavated, a pattern of the driving circuit layer 12 will not be formed on the to-be-dug area. There is no overlapped area between an orthographic projection of the to-be-dug area H on the base substrate 11 and an orthographic projection of the metal layer in the driving circuit layer 12 on the base substrate 11.

The annular isolation area VA1 is configured to separate a position where the through hole is disposed and the display area AA by a certain distance, so as to avoid the influence on the display area AA caused by hole digging in the display screen. A plurality of annular blocking dams may be disposed in the annular isolation area VA1 to prevent the through hole from transmitting water vapor and oxygen to the display area AA to cause damage to a display device in the display area AA.

As shown in FIG. 3, the above annular blocking dam at least include first annular blocking dams d1, and the first annular blocking dams d1 define the scope of the to-be-dug area H. In the final hole digging stage, the area H surrounded by the first annular blocking dam d1 will be excavated to form the above through hole.

The annular blocking dams disposed in the annular isolation area VA1 are all formed by adopting the same patterning process through at least one corresponding film layer in the driving circuit layer.

The electroluminescent layer 13 is arranged on the base substrate 11 and the first annular blocking dam d1. The display panel provided by embodiments of the present disclosure may be an OLED panel, and the electroluminescent layer 13 contains a plurality of organic light-emitting diode devices. Each organic light-emitting diode device include a first electrode connected with the driving circuit layer 12, a second electrode disposed opposite to the first electrode, and an organic light-emitting layer located between the first electrode and the second electrode. By applying a voltage to the first electrodes and the second electrodes, electrons and holes can be driven to generate excitons in the organic light-emitting layer, and the excitons are stimulated to emit the light.

As shown in FIG. 3, an orthographic projection of the electroluminescent layer 13 on the base substrate 11 covers all areas where the to-be-dug area H, the annular isolation area VA1 and the display area AA are located. After the display panel is manufactured, the to-be-dug area H will be completely excavated, so there is no electroluminescent layer 13 in the finally formed through hole.

The encapsulation layer 14 is disposed on a side, facing away from the base substrate 11, of the electroluminescent layer 13. An organic light-emitting material and an organic functional material in the electroluminescent layer 13 will be destroyed when encountering water and oxygen, thereby seriously affecting the service life. In order to prevent the organic material from making contact with the water and the oxygen, the encapsulation layer 14 is disposed on a side, facing away from the base substrate 11, of the electroluminescent layer 13.

As shown in FIG. 3, the encapsulation layer 14 usually includes an inorganic encapsulation layer and an organic encapsulation layer 142 alternately disposed in a lamination mode, the inorganic encapsulation layer may adopt materials such as silicon oxide or silicon nitride, which has a good function of isolating the water and the oxygen. Disposing the organic encapsulation layer 142 between the inorganic encapsulation layers can increase the flexibility of the encapsulation layer 14, which is suitable for the flexible display panel. The inorganic encapsulation layer may be formed by adopting a chemical vapor deposition process, and the organic encapsulation layer may be formed by an inkjet printing process.

The encapsulation layer 14 may include two inorganic encapsulation layers and one organic encapsulation layer 142. The inorganic encapsulation layers are a first inorganic encapsulation layer 141*a* and a second inorganic encapsulation layer 141*b*, and the organic encapsulation layer 142 is located between the first inorganic encapsulation layer 141*a* and the second inorganic encapsulation layer 141*b*.

Normally, the inorganic encapsulation layers 141*a* and 141*b* cover all the areas of the display panel, including the to-be-dug area H, the annular isolation area VA1 and the display area AA in FIG. 3, while the organic encapsulation layer 142 only covers the area where the display area AA is located.

In this case, since there are fewer film layers in the to-be-dug area H compared to other positions, when the flexible substrate 10 is peeled from the base substrate 11, strength in the to-be-dug area H is poor, the film layers in this area are easily separated from each other when pulled by external force, so that the problem of rainbow patterns is prone to being formed in this area.

Figure 4:
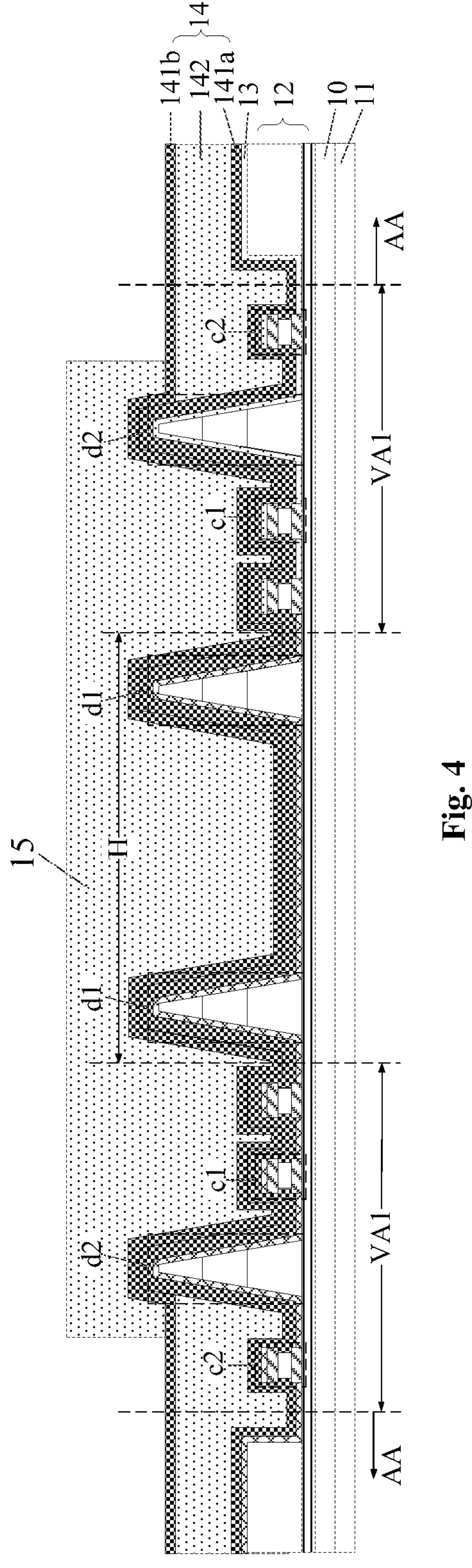
FIG. 4 is a first schematic diagram of a section structure of a display panel at a to-be-dug area provided by an embodiment of the present disclosure.

FIG. 4 is a first schematic diagram of a section structure of the display panel at the to-be-dug area provided by an embodiment of the present disclosure.

In order to avoid the above problems, as shown in FIG. 4, in embodiments of the present disclosure, a filling layer 15 is further disposed on a side, facing away from the base substrate 11, of the annular isolation area VA1 and a side, facing away from the base substrate 11, of the encapsulation layer 14 of the to-be-dug area H.

As shown in FIG. 4, an orthographic projection of the filling layer 15 on the base substrate 11 is within a range of orthographic projections of the to-be-dug area H and the annular isolation area VA1 on the base substrate 11. The filling layer 15 is configured to fill a gap formed between the to-be-dug area H and the display area AA, so as to enhance the strength in the to-be-dug area H. After the filling layer 15 is formed in the to-be-dug area H, the flexible substrate 10 is peeled from the base substrate 11, which can effectively reduce the problem of film layer separation.

The filling layer 15 may be made of an organic material, for example, an organic resin material, with a thickness of 2 μm-4 μm. The organic material usually has a large thickness, and may fill the film layer gap formed in the to-be-dug area H.

However, the current display panels all have a touch control function. For an OLED panel, after the encapsulation layer 14 is manufactured, a Flexible Multi-Layer On Cell (FMLOC for short) technology may be adopted to manufacture a metal grid touch electrode layer on the encapsulation layer 14 without the need for a plug-in touchpad. This process can reduce the thickness of the screen, which is further conducive to folding: at the same time, there is no fit tolerance, which can reduce a width of a border.

Before performing the FMLOC process, the display panel needs to be baked. The filling layer 15 is usually made of the organic material. The organic material will shrink in the baking process, and the thickness of the filling layer 15 is the largest in the to-be-dug area H. Therefore, in the shrinkage process of the filling layer 15, a large tensile force will be generated on an underlying film layer in the to-be-dug area H, which may still lead to the separation of the film layer, thereby causing a problem of rainbow patterns.

Figure 5:
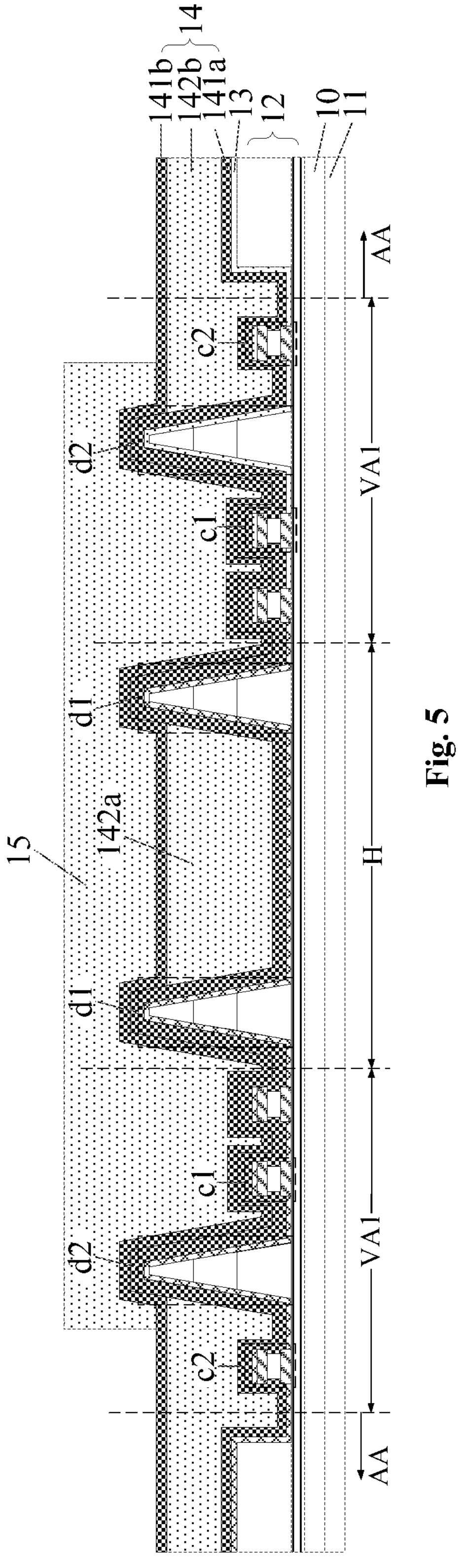
FIG. 5 is a second schematic diagram of a section structure of a display panel at a to-be-dug area provided by an embodiment of the present disclosure.

FIG. 5 is a second schematic diagram of a section structure of the display panel at the to-be-dug area provided by the embodiment of the present disclosure.

In order to avoid the above problem, as shown in FIG. 5, when the electroluminescent layer 13 is encapsulated, an organic encapsulation layer is formed in the to-be-dug area H in the embodiment of the present disclosure, thereby reducing the thickness of the filling layer 15 at the to-be-dug area H, reducing a pulling effect of the lower film layer in the to-be-dug area H in the shrinking process of the filling layer 15, and thus completely avoiding the rainbow pattern problem caused by the separation of the film layers.

In some embodiments of the present disclosure, the organic encapsulation layer in the encapsulation layer is divided into two parts, namely a first organic encapsulation part 142*a* and a second organic encapsulation part 142*b*, wherein the first organic encapsulation part 142*a* covers the to-be-dug area H. and is located between the first inorganic encapsulation layer 141*a* and the second inorganic encapsulation layer 141*b* corresponding to the to-be-dug area H: and the second organic encapsulation layer 142*b* covers the display area AA, and is located between the first inorganic encapsulation layer 141*a* and the second inorganic encapsulation layer 141*b* corresponding to the display area AA.

The first organic encapsulation part 142*a* and the second organic encapsulation part 142*b* are formed in one-time process, and the organic encapsulation layer may be formed in the to-be-dug area H and the display area AA by an inkjet printing technology. After the first organic encapsulation part 142*a* is injected into the to-be-dug area H, the thickness of the filling layer 15 in the to-be-dug area H may be effectively reduced when the filling layer 15 is formed, and the filling layer 15 will not directly make contact with the lower inorganic encapsulation layer 141*a* and 141*b* when shrinking, which will not cause separation between the film layers, and avoid the phenomenon of the rainbow patterns.

The first annular blocking dam d1 is manufactured by stacking through a plurality of film layers in the driving circuit layer 12, so that the first annular blocking dam d1 has a certain height. Then when the material of the organic encapsulation layer is subjected to inkjet printing, liquid of the organic encapsulation layer may be limited within the scope of the first annular blocking dam d1, so that the height of the first annular blocking dam d1 is greater than the thickness of the organic encapsulation layer, thereby preventing a liquid material of the organic encapsulation layer from overflowing into the annular isolation area VA1, preventing the organic encapsulation layer from generating a passage extending to the display area AA, and preventing water and oxygen from entering the display area AA.

In the embodiment of the present disclosure, while a first annular blocking dam surrounding the to-be-dug area is formed in the annular isolation area on one side of the flexible substrate facing away from the base substrate, a second annular blocking dam surrounding the first annular blocking dam, and a plurality of second annular isolation parts located between the first annular blocking dam and the second annular blocking dam and surrounding the second annular blocking dam will further be formed. In order to distinguish the isolation parts at the different positions, in the embodiment of the present disclosure, the annular isolation part located between the first annular blocking dam and the second annular blocking dam is called the first annular isolation part, and the annular isolation part surrounding the second annular blocking dam is called the second annular isolation part.

As shown in FIG. 5, in the display panel provided by the embodiment of the present disclosure, the annular isolation area VA1 further includes: a second annular blocking dam d2, at least one first annular isolation part c1 and at least one second annular isolation part c2.

The second annular blocking dam d2 surrounds the first annular blocking dam d1. The first annular blocking dam d1 and the second annular blocking dam d2 may be of a concentric structure, and the first annular blocking dam d1 and the second annular blocking dam d2 are separated by a set distance.

At least one first annular isolation part c1 is further disposed between the first annular blocking dam d1 and the second annular blocking dam d2: and at least one second annular part c2 further surrounds the second annular blocking dam d2.

As mentioned above, the organic encapsulation layer needs to be partitioned in the annular isolation area VA1 to avoid that a passage is formed to enable external water and oxygen enter the display area AA. The first annular blocking dam d1 is configured to define the first organic encapsulation part 142*a* in the to-be-dug area H in the first annular blocking dam d1, and the second annular blocking dam d2 is configured to define the second organic encapsulation part 142*b* in the display area AA, so as to partition the organic encapsulation layer in the annular isolation area VA1.

The at least one first annular part c1 is disposed between the first annular blocking dam d1 and the second annular blocking dam d2, and at least one second annular part c2 is disposed on an outer side of the second annular blocking dam d2, which can play a role in blocking water and oxygen, preventing crack extension, and partitioning electroluminescent layer 13.

In some embodiments, the forming the driving circuit layer on one side of the flexible substrate facing away from the base substrate includes:

a buffer layer is formed on the base substrate;

a pattern of an active layer is formed on a side, facing away from the base substrate, of the buffer layer;

a gate insulating layer is formed on a side, facing away from the buffer layer, of the active layer;

a pattern of a gate metal layer is formed on one side of the gate insulating layer facing away from the active layer;

an interlayer insulating layer is formed on a side, facing away from the gate insulating layer, of the gate metal layer;

a pattern of a source-drain metal layer is formed on a side, facing away from the gate metal layer, of the interlayer insulating layer: and a planarization layer is formed on a side, facing away from the interlayer insulating layer, of the source-drain metal layer.

Figure 6:
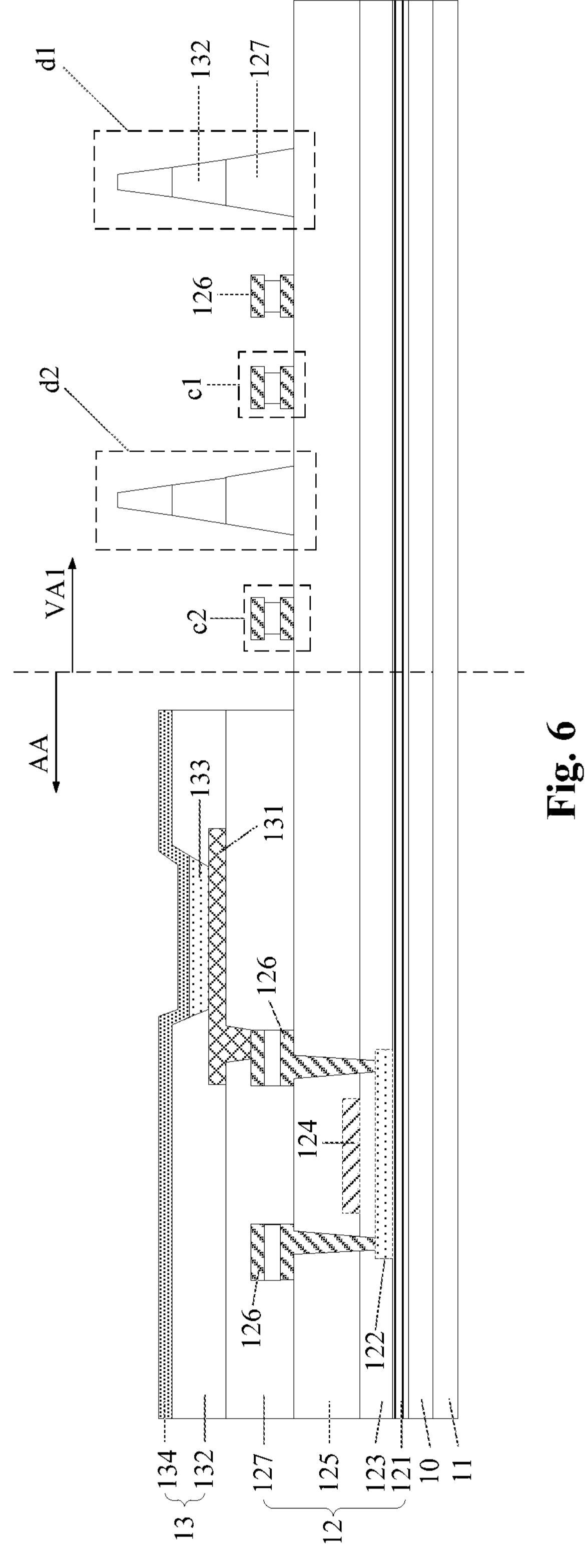
FIG. 6 is a first schematic diagram of a section structure of a display panel provided by an embodiment of the present disclosure.
Figure 7:
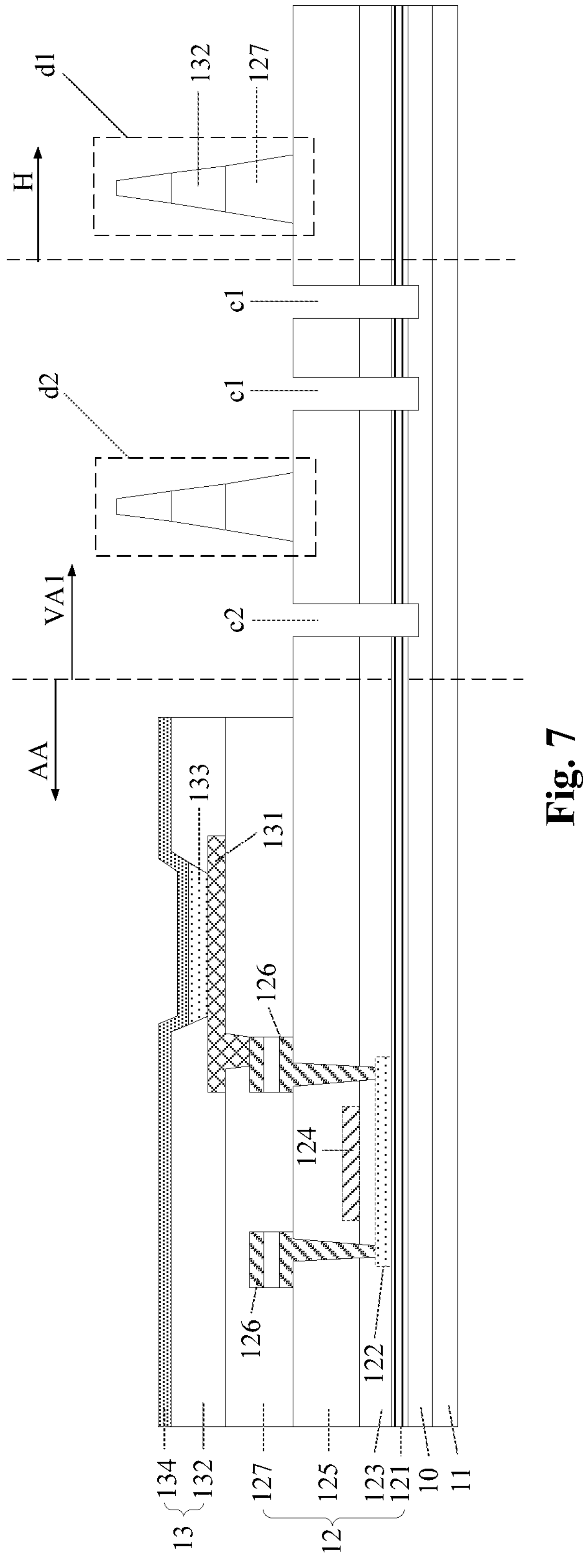
FIG. 7 is a second schematic diagram of a section structure of a display panel provided by an embodiment of the present disclosure.

FIG. 6 is a first schematic diagram of a section structure of the display panel provided by an embodiment of the present disclosure. FIG. 7 is a second schematic diagram of the section structure of the display panel provided by an embodiment of the present disclosure. For convenience of explanation, FIG. 6 and FIG. 7 only show structures of the annular blocking dam and the annular isolation spacer on a side of the to-be-dug area H.

As shown in FIG. 6 and FIG. 7, the driving circuit layer 12 includes as follow.

The buffer layer 121, disposed on the base substrate 11. The buffer layer 121 may match the stress between the base substrate 11 and the upper film layer, and may also improve the sealing performance of the display panel. The buffer layer 121 may be made of inorganic materials, which is not limited here.

The active layer 122, disposed on a side, facing away from the base substrate 11, of the buffer layer 121. The active layer 122 is a functional film layer for manufacturing a thin film transistor, and the active layer 122 has a preset pattern.

The active layer 122 includes a source area and a drain area formed by doping N-type ions or P-type ions, and an area between the source area and the drain area is an undoped channel area.

The gate insulating layer 123, disposed on a side, facing away from the buffer layer 121, of the active layer 122. The gate insulating layer 123 is configured to insulate a metal layer above the active layer 122. A material of the gate insulating layer 123 may be silicon oxide, silicon nitride or the like, which is not limited here.

The gate metal layer 124, disposed on a side, facing away from the active layer 122, of the gate insulating layer 123. The gate metal layer 124 has a pattern including a gate electrode and a gate line. The gate metal layer 124 may adopt a lamination structure of single-layer or multi-layer metal, which is not limited here.

The interlayer insulating layer 125, disposed on a side, facing away from the gate insulating layer 123, of the gate metal layer 124. The interlayer insulating layer 125 is configured to insulate a metal layer above the gate metal layer 124. The material of the gate insulating layer 125 may be silicon oxide, silicon nitride or the like, which is not limited here.

The source-drain metal layer 126, disposed on a side, facing away from the gate metal layer 124, of the interlayer insulating layer 125. The source-drain metal layer 126 has a pattern including a source electrode, a drain electrode and a data line. The source-drain metal layer 126 may adopt a lamination structure of single-layer or multi-layer metal, which is not limited here.

The active layer, the gate electrode, the source electrode and the drain electrode constitute a thin film transistor structure.

The planarization layer 127, disposed on a side, facing away from the interlayer insulating layer 125, of the source-drain metal layer 126. The planarization layer 127 is configured to insulate the source-drain metal layer 126, and meanwhile, level the surface of the film layer, which is beneficial for forming other devices on the planarization layer 127. The planarization layer 127 may be made of an inorganic material or an organic material, which is not limited here. The surface of the planarization layer 127 has a via hole exposing the drain electrode.

After the above driving circuit layer 12 is formed on the base substrate 11, the electroluminescent layer 13 is manufactured on the driving circuit layer 12.

In some embodiments, the forming the electroluminescent layer on the base substrate and the annular blocking dam includes:

- a pattern of a first electrode layer is formed on a side, facing away from the source-drain metal layer, of the planarization layer;
- a pattern of a pixel defining layer is formed on a side, facing away from the source-drain metal layer, of the planarization layer;
- a pattern of a supporting part is formed on a side, facing away from the planarization layer, of the pixel defining layer;
- a light-emitting layer is formed on a side, facing away from the planarization layer, of the first electrode layer: and
- a second electrode layer is formed on a side, facing away from the first electrode layer, of the light-emitting layer.

As shown in FIG. 6 and FIG. 7, the electroluminescent layer 13 includes as follow.

A first electrode layer 131, disposed on a side, facing away from the source-drain metal layer 126, of the planarization layer 127. The first electrode layer 131 includes a plurality of first electrodes separated from each other, and each first electrode is electrically connected with the drain electrode of the lower thin film transistor through a via hole of the planarization layer 127 to transmit a driving signal to the first electrode. The material of the first electrode layer 131 may be a transparent conductive material such as indium tin oxide, which is not limited here.

A pixel defining layer 132, disposed on a side of the planarization layer 127 facing away from the source-drain metal layer 126 and disposed at a spacing position between all the first electrodes. The pixel defining layer 132 is configured to separate areas where the first electrodes are located, and has a larger thickness than the first electrode layer 131 and other organic functional film layers.

A support part (not shown in the figure), disposed on a side of the pixel defining layer 132 facing away from the planarization layer 127. The support part is configured to support other components above the display panel.

A light-emitting layer 133, disposed on one side of the first electrode facing away from the planarization layer 127. The light-emitting layers 133 formed on the different first electrodes may adopt the same material or the different materials. In the display panel provided by the embodiment of the present disclosure, the light-emitting layer 133 may adopt organic light-emitting materials that emit different colors, and the light-emitting layer is only formed on the corresponding first electrodes: or, the light-emitting layer 133 may also adopt an organic light-emitting material that emits white light, the light-emitting layer is disposed in the whole layer, and then a color film substrate is disposed to realize the emission of light of the different colors.

A second electrode layer 134, disposed on one side of the light-emitting layer 133, the pixel defining layer 132, and the support part facing away from the planarization layer 127. The second electrode layer 134 is disposed in the whole layer, and the material of the second electrode layer 134 may be a conductive material such as metallic silver, which is not limited here.

The first annular blocking dam d1 and the second annular blocking dam d2 may be manufactured by adopting at least one of the planarization layer 127, the pixel defining layer 132 and the support part.

In some embodiments, as shown in FIG. 6, the first annular isolation part c1 and the second annular isolation part c2 may adopt a form of an annular isolation spacer. The annular isolation spacer may be manufactured through the source-drain metal layer 126, and the source-drain metal layer 126 is usually manufactured through laminated metal, for example, titanium/aluminum/titanium three-layer metal, and therefore, the annular isolation spacer may also be manufactured through the titanium/aluminum/titanium three-layer metal. Since an edge and corner of the annular isolation spacer facing away from the base substrate 11 is relatively sharp, the annular isolation spacer may play the role of cutting off the electroluminescent layer 13, so that the electroluminescent layers 13 in the display area AA and the annular isolation area VA1 are disconnected.

In some embodiments, as shown in FIG. 7, the first annular isolation part c1 and the second annular isolation part c2 may further adopt a form of an annular isolation groove. A structure of the annular isolation groove is formed by etching the film layers such as the flexible substrate 10, the buffer layer 121, the gate insulating layer 123 and the interlayer insulating layer 125 after being formed. The annular isolation groove has a large depth, then when the electroluminescent layer 13 is formed, the annular isolation groove may disconnect the electroluminescent layer 13, so that the electroluminescent layers 13 in the display area AA and the annular isolation area VA1 are disconnected.

As shown in FIG. 5, an orthographic projection of the filling layer 15 on the base substrate 11 has an overlapped area with the orthographic projection of the second organic encapsulation part 142*b* on the base substrate 11.

The filling layer 15 is configured to perform film layer filling on the to-be-dug area H and the annular isolation area VA1, thereby increasing the strength of the film layer originally compared with a thin film area. The to-be-dug area H and the annular isolation area VA1 are covered with the filling layer 15, thus the thickness in these two areas may be increased, and the film layer separation problem caused when the flexible substrate 10 is peeled from the base substrate 11 is avoided.

The second annular blocking dam d2 may define the inkjet printing scope of the organic encapsulation material when the second organic packaging part 142*b* is formed, so as to prevent the organic encapsulation material from overflowing the second annular blocking dam d2. Therefore, in some embodiments of the present disclosure, the second organic encapsulation part 142*b* may cover the second annular isolation post c2 and a side wall of one side of the second annular blocking dam d2 facing away from the first annular blocking dam d1, without exceeding the scope of the second annular blocking dam d2.

After forming the encapsulation layer 14 and the filling layer 15, the manufacturing method of the display panel provided by embodiments of the present disclosure further includes:

a blocking layer is formed on a side, facing away from the base substrate, of the filling layer and a side, facing away from the base substrate, of the encapsulation layer;

a touch functional layer is formed on a side, facing away from the base substrate, of the blocking layer: and a protective layer is formed on a side, facing away from the blocking layer, of the touch functional layer, the touch functional layer includes a pattern of a touch electrode, and an orthographic projection of the pattern of the touch electrode on the base substrate does not overlap with the orthographic projection of the filling layer on the base substrate.

Because the filling layer 15 is manufactured through the organic material, the filling layer 15 usually has a large thickness. As shown in FIG. 5, a surface of one side of the filling layer 15 facing away from the base substrate 11 is higher than a surface of one side of the encapsulation layer 14 in the display area AA facing away from the base substrate 11. Then an edge of the filling layer 15 will have a sharper edge, and when the subsequent touch functional layer is formed, the touch electrode in the touch functional layer may be cut off.

Figure 8:
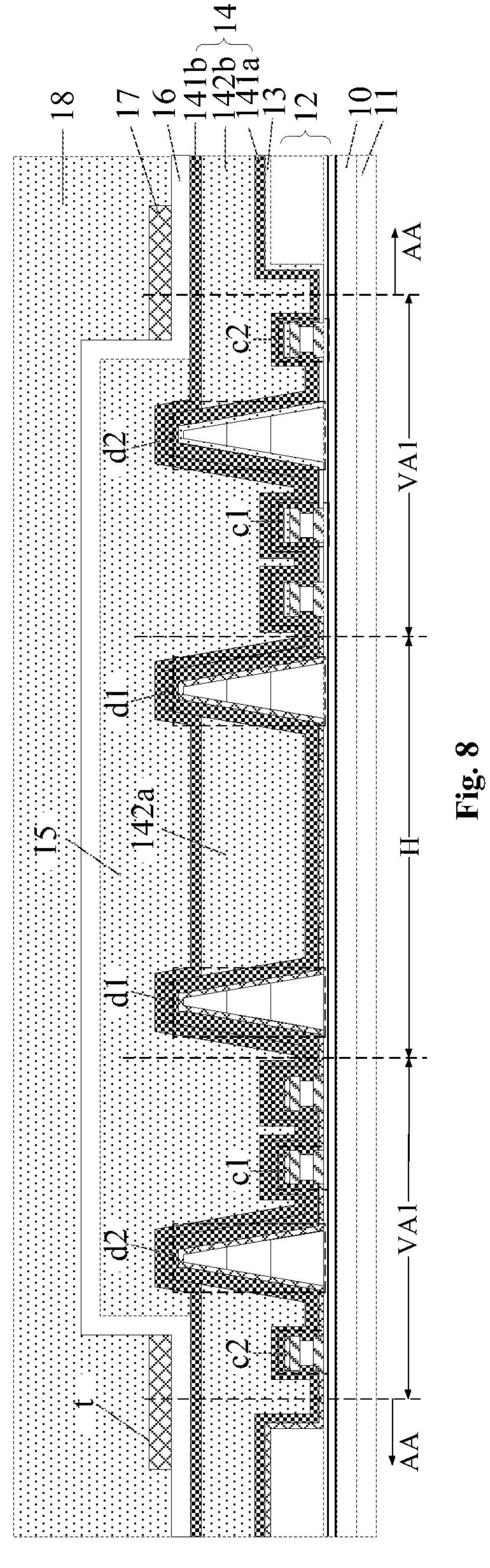
FIG. 8 is a third schematic diagram of a section structure of a display panel at a to-be-dug area provided by an embodiment of the present disclosure.
Figure 9:
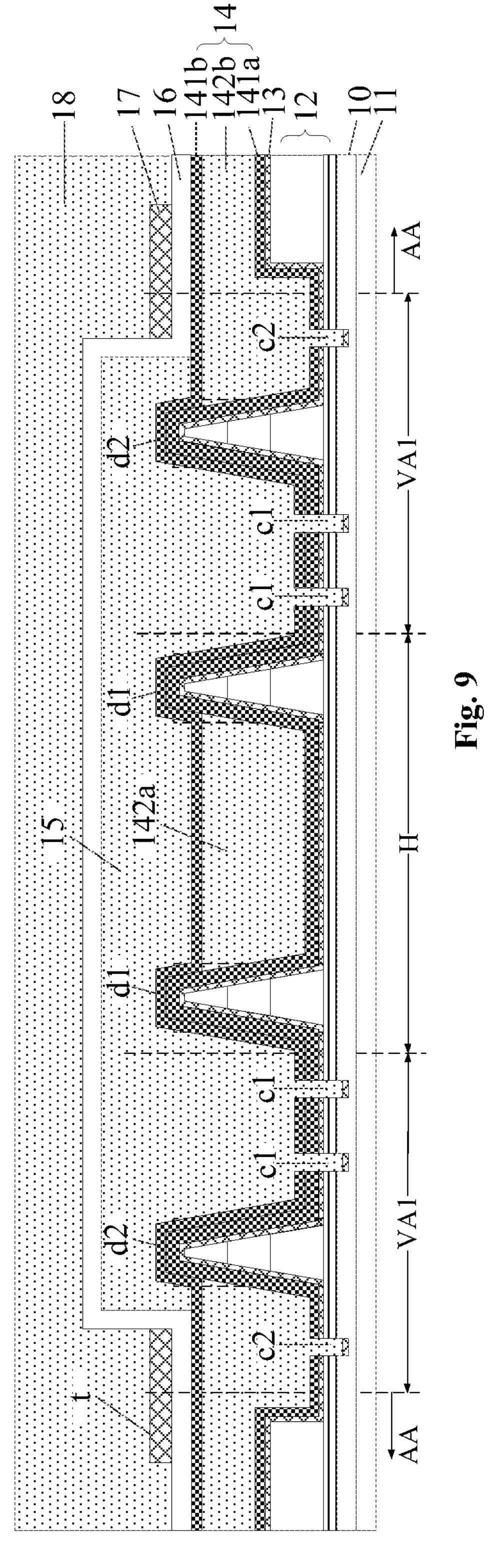
FIG. 9) is a fourth schematic diagram of a section structure of a display panel at a to-be-dug area provided by an embodiment of the present disclosure.

FIG. 8 is a third schematic diagram of a section structure of the display panel at the to-be-dug area provided by an embodiment of the present disclosure. FIG. 9 is a fourth schematic diagram of the section structure of the display panel at the to-be-dug area provided by an embodiment of the present disclosure.

In order to avoid the above problem, as shown in FIG. 8 and FIG. 9, the blocking layer 16 is disposed on a side, facing away from the base substrate 11, of the encapsulation layer 14 and a side, facing away from the base substrate 11, of the filling layer 15. The blocking layer 16 plays a blocking role between the electroluminescent layer 13 and the touch electrode. The blocking layer 16 may be manufactured through an inorganic material, which is not limited here.

The touch functional layer 17 is disposed on a side, facing away from the base substrate 11, of the buffer layer 16. The touch functional layer 17 includes the touch electrode. The touch functional layer 17 usually includes a plurality of metal layers, and a pattern of the touch electrode is manufactured on the metal layers to realize a touch control function.

The protective layer 18 is disposed on a side, facing away from the blocking layer 16, of the touch functional layer 17. The protective layer 18 is configured to insulate and protect the touch functional layer 17 and meanwhile has the function of flattening. The protective layer 18 may be manufactured through an organic material, for example, an organic resin material, which is not limited here.

As shown in FIG. 6, an orthographic projection of the touch electrode on the base substrate 11 does not mutually overlap with the orthographic projection of the filling layer 15 on the base substrate 11. The scope of the filling layer 15 is indented to the annular isolation area VA1, and the pattern of the touch electrode and the filling layer 15 are prevented from overlapping with each other, so that the touch electrode may be prevented from being cut by the edge of the filling layer 15, and communication signals of the touch electrode are ensured.

In some embodiments, the forming the touch functional layer on one side of the blocking layer facing away from the base substrate includes:

a first metal layer is formed on a side, facing away from the base substrate, of the blocking layer;

a touch insulating layer is formed on a side, facing away from the blocking layer, of the first metal layer: and a second metal layer is formed on a side, facing away from the first metal layer, of the touch insulating layer, the first metal layer includes a pattern of a first touch electrode connection part, and the second metal layer includes a pattern of a first touch electrode, a pattern of a second touch electrode and a pattern of a second touch electrode connection part: and an orthographic projection of the first touch electrode connection part on the base substrate does not overlap with the orthographic projection of the filling layer on the base substrate.

Figure 10:
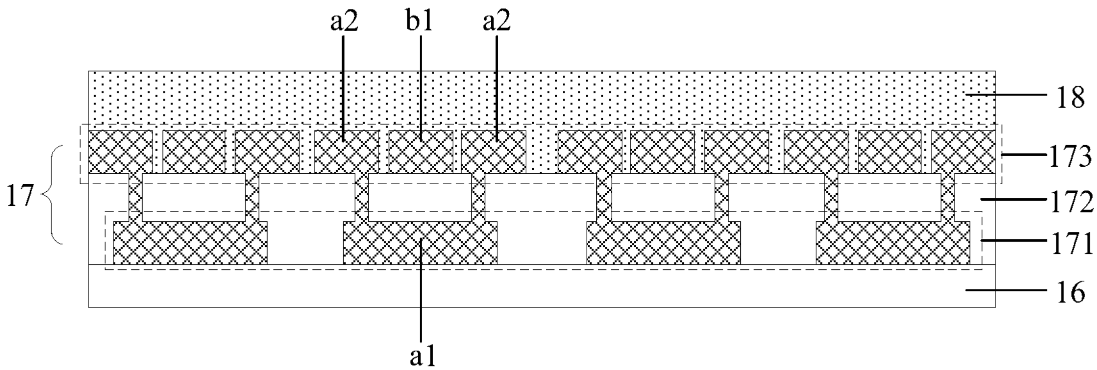
FIG. 10 is a schematic diagram of a section structure of a touch functional layer provided by an embodiment of the present disclosure.

FIG. 10 is a schematic diagram of a section structure of a touch functional layer provided by an embodiment of the present disclosure.

As shown in FIG. 10, the touch functional layer 17 includes as follow:

The first metal layer 171, disposed on a side of the blocking layer 16 facing away from the base substrate 11. The first metal layer includes the pattern of the first touch electrode connection part a1.

The touch insulating layer 172, disposed on a side of the first metal layer 171 facing away from the substrate 16. The touch insulating layer 172 is configured to insulate the metal layer, and may usually be manufactured through an inorganic material, which is not limited here.

The second metal layer 173, disposed on a side of the touch insulating layer 172 facing away from the first metal layer 171. The second metal layer 173 includes the patterns of the first touch electrode a2, the second touch electrode (not shown in the figure) and the second touch electrode connection part b1: and the first touch electrode connection part a1 located on the first metal layer 171 is connected with the first touch electrode a2 located in the second metal layer through a via hole of the touch insulating layer 172.

An orthographic projection of the first touch electrode connection part a1 on the base substrate 11 does not overlap with the orthographic projection of the filling layer 15 on the base substrate 11. The first touch electrode and the second touch electrode usually adopt a metal grid structure. When the pattern of the second metal layer 173 is formed, the to-be-dug area H and the annular isolation area VA1 will be hollowed out. Therefore, there is no metal network pattern in the to-be-dug area H and annular isolation area VA1.

After the above display panel is formed, the manufacturing method of the display panel provided by embodiments of the present disclosure further includes:

the flexible substrate is peeled on the base substrate; and a hole is dug on the to-be-dug area in the display panel.

In some embodiments of the present disclosure, when the electroluminescent layer is encapsulated, the organic encapsulation layer is formed in the to-be-dug area together, thereby reducing the thickness of the filling layer in the to-be-dug area, reducing a pulling effect of the lower film layer in the to-be-dug area in the shrinking process of the filling layer, and thus completely avoiding the rainbow pattern problem caused when the flexible substrate is peeled.

As shown in FIG. 8 and FIG. 9, when hole digging is performed on the display panel, a cutting line is arranged between the first annular blocking dam d1 and the first annular isolation part c1 adjacent to it, so after hole digging is performed on the display screen, the first organic encapsulation part 141*a* and the first annular blocking dam d1 surrounding the first organic encapsulation part between two dotted lines in FIG. 8 and FIG. 9 are excavated.

Based on the same inventive concept, an embodiment of the present disclosure further provides a display panel, manufactured by any of the above manufacturing method. When an electroluminescent layer is encapsulated through the display panel provided by some embodiments of the present disclosure, an organic encapsulation layer is formed in a to-be-dug area together, thereby reducing a thickness of a filling layer in the to-be-dug area, reducing a pulling effect of a lower film layer in the to-be-dug area in a shrinking process of the filling layer, and thus completely avoiding a rainbow pattern problem caused when a flexible substrate is peeled.

Figure 11:
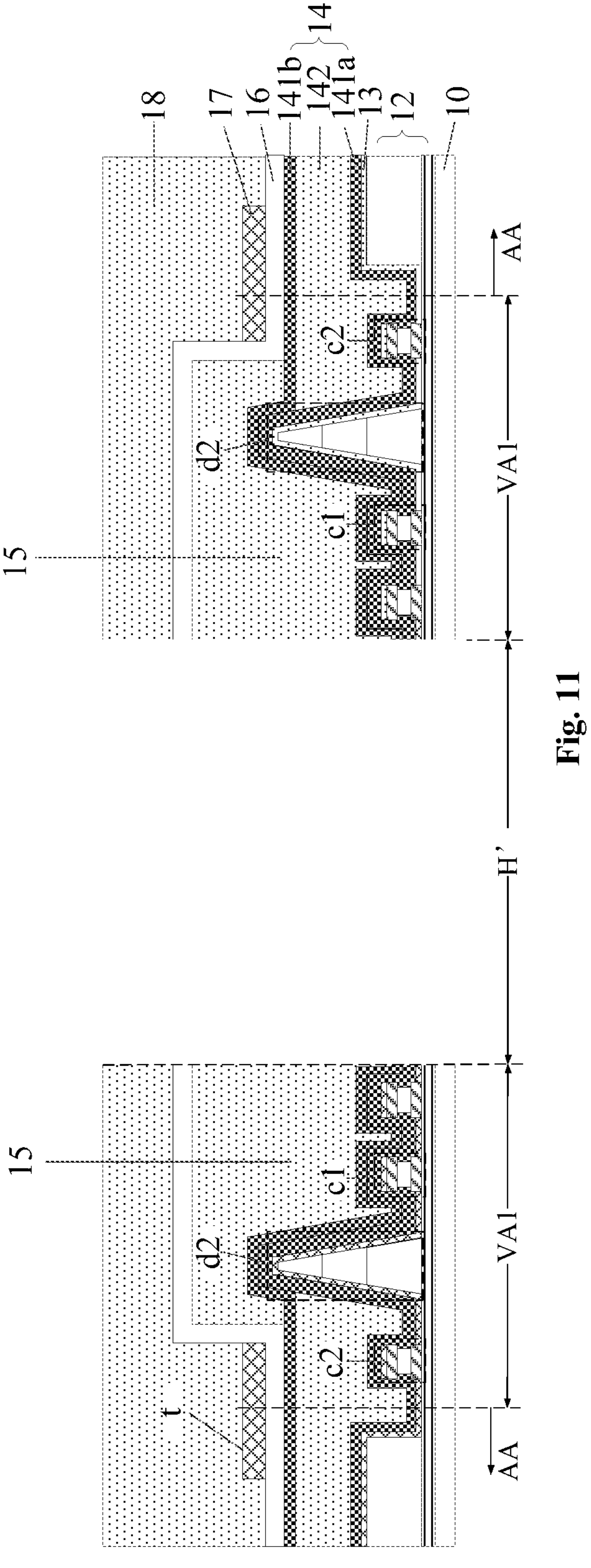
FIG. 11 is a first schematic diagram of a section structure of a display panel at a hole digging area provided by an embodiment of the present disclosure.

FIG. 11 is a first schematic diagram of a section structure of a display panel at a hole digging area provided by an embodiment of the present disclosure.

As shown in FIG. 11, the display panel includes: a flexible substrate 10, a driving circuit layer 12, an electroluminescent layer 13, an encapsulation layer 14, a filling layer 15, a blocking layer 16, a touch functional layer 17 and a protective layer 18.

The flexible substrate 10 includes a display area AA, surrounding at least one hole digging area H', and an annular isolation area VA1 located between the display area AA and the hole digging area H'.

The driving circuit layer 12 is disposed on the flexible substrate 10; the electroluminescent layer 13 is disposed on a side of the driving circuit layer 12 facing away from the flexible substrate 10: the encapsulation layer 14 is disposed on a side of the electroluminescent layer 13 facing away from the flexible substrate 10: the filling layer 15 is disposed on a side of the encapsulation layer 14 facing away from the electroluminescent layer 13: the blocking layer 16 is disposed on a side of the encapsulation layer 14 and the filling layer 15 facing away from the electroluminescent layer 13: the touch functional layer 17 is disposed on a side of the blocking layer 16 facing away from the encapsulation layer 14: and the protective layer 18 is disposed on a side of the touch functional layer 17 and the blocking layer 16 facing away from the encapsulation layer 14.

Figure 12:
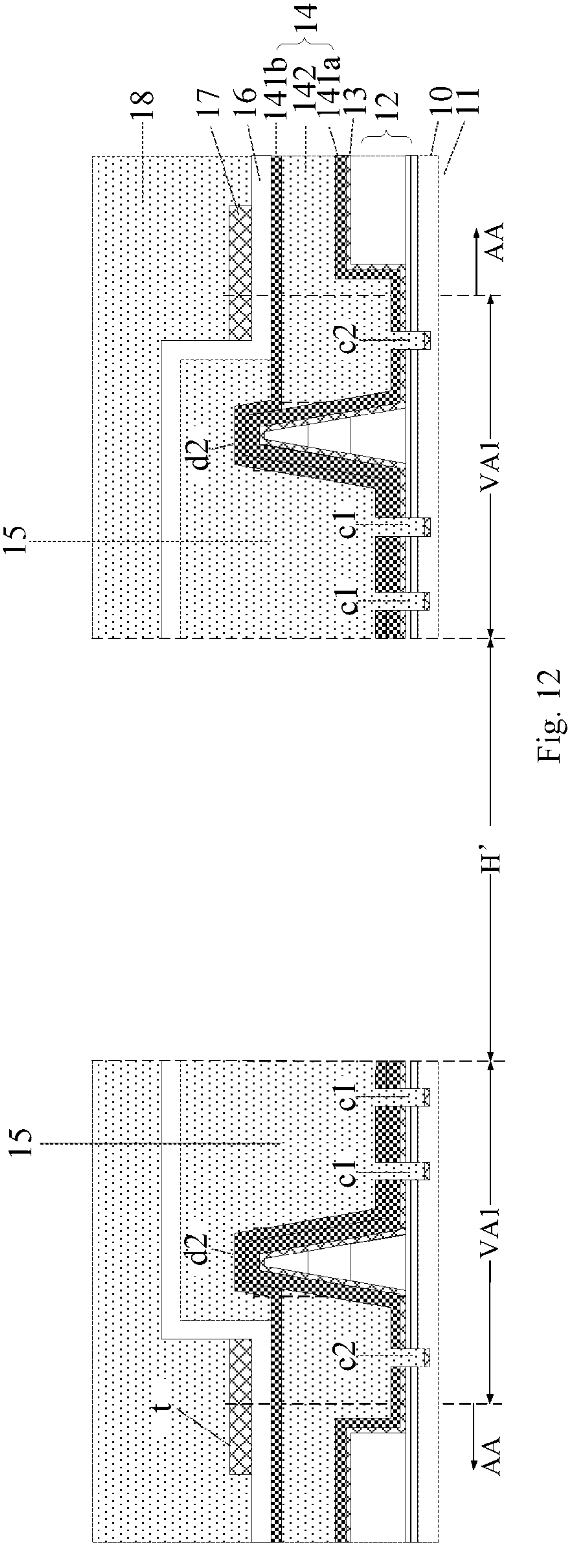
FIG. 12 is a second schematic diagram of a section structure of a display panel at a hole digging area provided by an embodiment of the present disclosure.

As shown in FIG. 11 and FIG. 12, the filling layer 15 in the display panel manufactured by adopting the above manufacturing method is in the annular isolation area VA1, and a surface of a side of the filling layer 15 facing away from the flexible substrate 10 is higher than a surface of a side of the encapsulation layer 14 in the display area AA facing away from the flexible substrate 10; and then, when the touch functional layer 17 is manufactured, an edge formed by the filling layer 15 may cut off a touch electrode in the touch functional layer.

In order to avoid the above problem, the filling layer 15 in some embodiments of the present disclosure is indented in a direction away from the display area AA during manufacturing, and a width of a touch control component adjacent to the filling layer 15 in the touch functional layer may be reduced, so that the filling layer 15 does not mutually overlap with a pattern of the touch electrode.

The structure of each film layer in the above display panel provided by embodiments of the present disclosure may refer to the above detailed introduction, which is not repeated here.

As shown in FIG. 11 and FIG. 12, the annular isolation area VA1 further includes:

an annular blocking dam d2, surrounding the to-be-dug area H';

at least one first annular isolation part c1, surrounded by the annular blocking dam d2; and at least one second annular isolation part c2, surrounding the annular blocking dam d2.

When the electroluminescent layer 13 is encapsulated, the encapsulation layer 14 includes a first inorganic encapsulation layer 141*a*, a second inorganic encapsulation layer 141*b* and an organic encapsulation layer 142 arranged between the first inorganic encapsulation layer 141*a* and the second inorganic encapsulation layer 141*b*. The annular blocking dam d2 may limit a material of the organic encapsulation layer 142 within the display area AA.

As shown in FIG. 11 and FIG. 12, the organic encapsulation layer 142 covers the second annular isolation part c2 and a side wall of a side of the annular blocking dam d2 facing the display area AA, but does not exceed a scope defined by the annular blocking dam d2.

The first annular isolation part c1 and the second annular isolation part c2 are configured to cut off the electroluminescent layer 13, so that the electroluminescent layers in the display area AA and the annular isolation area VA1 may be disconnected, to block a water and oxygen transmission path, and prevent the water and the oxygen from entering an organic light-emitting diode device of the display area AA.

As shown in FIG. 11 and FIG. 12, there is an overlapped area between an orthographic projection of the filling layer 15 on the flexible substrate 10 and an orthographic projection of the organic encapsulation layer 142 on the flexible substrate 10. The filling layer 15 covers the annular blocking dam d2, but an edge of one side of the filling layer 15 close to the display area AA does not exceed an edge of the second annular isolation part c2 closest to the display area AA.

In order to avoid influence of the filling layer 15 on devices in the display area AA, and avoid damage of the filling layer 15 to the touch electrode pattern, the edge of the filling layer 15 is limited within a scope of the second annular isolation part c2 closest to the display area AA.

As shown in FIG. 11, the first annular isolation part c1 and the second annular isolation part c2 may adopt a form of an annular isolation spacer. The annular isolation spacer may be manufactured through a source-drain metal layer, and the source-drain metal layer is usually manufactured through laminated metal, for example, titanium/aluminum/titanium three-layer metal, and therefore, the annular isolation spacer may also be manufactured through the titanium/aluminum/titanium three-layer metal. Since an edge and corner of the annular isolation spacer facing away from the flexible substrate 10 is relatively sharp, the annular isolation spacer may play a role of cutting off the electroluminescent layer 13, so that the electroluminescent layers 13 in the display area AA and the annular isolation area VA1 are disconnected.

As shown in FIG. 12, the first annular isolation part c1 and the second annular isolation part c2 may further adopt a form of an annular isolation groove. A structure of the annular isolation groove is formed by etching film layers such as the flexible substrate 10, the buffer layer, the gate insulating layer and the interlayer insulating layer after being formed. The annular isolation groove has a large depth, then when the electroluminescent layer 13 is formed, the annular isolation groove may disconnect the electroluminescent layer 13, so that the electroluminescent layers 13 in the display area AA and the annular isolation area VA1 are disconnected.

The specific structure of the display panel provided by the embodiment of the present disclosure may refer to implementation of the manufacturing method thereof, and repetitions are omitted.

On the other hand, an embodiment of the present disclosure further provides an apparatus, including any of the above display panel. Principles of the display apparatus for solving the problems are similar to that of the above display panel, therefore, implementation of the display apparatus may refer to that of the above display panel, and repetitions are omitted.

Although the preferred embodiments of the present disclosure have been described, those skilled in the art can make additional modifications and variations on these embodiments once they know the basic creative concept. Therefore, the appended claim intends to be explained as including the preferred embodiments and all modifications and variations falling within the scope of the present disclosure.

Obviously, those skilled in the art can make various modifications and variations to the embodiment of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A manufacturing method of a display panel, wherein the display panel comprises a display area, at least one to-be-dug area surrounded by the display area, and an annular isolation area arranged between the to-be-dug area and the display area; and the manufacturing method comprises:

forming an annular blocking dam surrounding the to-be-dug area in the annular isolation area on a base substrate;

forming an electroluminescent layer on the base substrate and the annular blocking dam;

forming an encapsulation layer on a side, facing away from the base substrate, of the electroluminescent layer; and forming a filling layer on a side, facing away from the electroluminescent layer, of the encapsulation layer in the to-be-dug area and a side, facing away from the electroluminescent layer, of the annular isolation area;

wherein the encapsulation layer comprises a first inorganic encapsulation layer, a second inorganic encapsulation layer, and an organic encapsulation layer disposed in a lamination mode;

the organic encapsulation layer comprises a first organic encapsulation part and a second organic encapsulation part;

the first organic encapsulation part covers the to-be-dug area, and is arranged between the first inorganic encapsulation layer and the second inorganic encapsulation layer corresponding to the to-be-dug area; and the second organic encapsulation layer covers the display area, and is arranged between the first inorganic encapsulation layer and the second inorganic encapsulation layer corresponding to the display area.

2. The manufacturing method according to claim 1, wherein a thickness of the first organic encapsulation part is smaller than a thickness of the annular blocking dam.

3. The manufacturing method according to claim 2, wherein the organic encapsulation layer is manufactured by an inkjet printing method.

4. The manufacturing method according to claim 1, wherein before forming the annular blocking dam, the manufacturing method further comprises:

forming a flexible substrate on the base substrate; and the forming the annular blocking dam on the base substrate comprises:

forming the annular blocking dam while forming a driving circuit layer on a side, facing away from the base substrate, of the flexible substrate.

5. The manufacturing method according to claim 4, wherein the forming the annular blocking dam while forming the driving circuit layer on the side, facing away from the base substrate, of the flexible substrate, comprises:

forming a first annular blocking dam surrounding the to-be-dug area, a second annular blocking dam surrounding the first annular blocking dam, and a plurality of annular isolation parts arranged between the first annular blocking dam and the second annular blocking dam, in the annular isolation area on the side, facing away from the base substrate, of the flexible substrate;

wherein the plurality of annular isolation parts surround the second annular blocking dam.

6. The manufacturing method according to claim 5, wherein the forming the driving circuit layer on the side, facing away from the base substrate, of the flexible substrate, comprises:

forming a buffer layer on the base substrate;

forming a pattern of an active layer on a side, facing away from the base substrate, of the buffer layer;

forming a gate insulating layer on a side, facing away from the buffer layer, of the active layer;

forming a pattern of a gate metal layer on a side, facing away from the active layer, of the gate insulating layer;

forming an interlayer insulating layer on a side, facing away from the gate insulating layer, of the gate metal layer;

forming a pattern of a source-drain metal layer on a side, facing away from the gate metal layer, of the interlayer insulating layer; and forming a planarization layer on a side, facing away from the interlayer insulating layer, of the source-drain metal layer.

7. The manufacturing method according to claim 6, wherein the annular isolation part is an annular isolation spacer, and the method further comprises:

forming the annular isolation spacer while forming the pattern of the source-drain metal layer.

8. The manufacturing method according to claim 6, wherein the annular isolation part is an annular isolation groove, and the method further comprises:

forming the annular isolation groove by etching the flexible substrate, the buffer layer, the gate insulating layer and the interlayer insulating layer formed in the annular isolation area.

9. The manufacturing method according to claim 6, wherein the forming the electroluminescent layer on the base substrate and the annular blocking dam comprises:

forming a pattern of a first electrode layer on a side, facing away from the source-drain metal layer, of the planarization layer;

forming a pattern of a pixel defining layer on a side, facing away from the source-drain metal layer, of the planarization layer;

forming a pattern of a supporting part on a side, facing away from the planarization layer, of the pixel defining layer;

forming a light-emitting layer on a side, facing away from the planarization layer, of the first electrode layer; and forming a second electrode layer on a side, facing away from the first electrode layer, of the light-emitting layer, wherein an orthographic projection of the pattern of the pixel defining layer on the base substrate partially overlaps with an orthographic projection of the pattern of the first electrode layer on the base substrate; and the first annular blocking dam and the second annular blocking dam are in a same layer as at least one of the planarization layer, the pixel defining layer or the supporting part.

10. The manufacturing method according to claim 1, wherein an orthographic projection of the filling layer on the base substrate has an overlapped area with an orthographic projection of the second organic encapsulation part on the base substrate.

11. The manufacturing method according to claim 10, wherein the second organic encapsulation part covers the second annular isolation spacer and a side wall of a side, facing away from the first annular blocking dam, of the second annular blocking dam.

12. The manufacturing method according to claim 1, wherein a surface of a side, facing away from the base substrate, of the filling layer is higher than a surface of a side, facing away from the base substrate, of the encapsulation layer in the display area.

13. The manufacturing method according to claim 12, further comprising:

forming a blocking layer on a side, facing away from the base substrate, of the filling layer and a side facing away from the base substrate, of the encapsulation layer;

forming a touch functional layer on a side, facing away from the base substrate, of the blocking layer; and forming a protective layer on a side, facing away from the blocking layer, of the touch functional layer, wherein the touch functional layer comprises a pattern of a touch electrode, and an orthographic projection of the pattern of the touch electrode on the base substrate does not overlap with an orthographic projection of the filling layer on the base substrate.

14. The manufacturing method according to claim 13, wherein the forming the touch functional layer on the side, facing away from the base substrate, of the blocking layer, comprises:

forming a first metal layer on a side, facing away from the base substrate, of the blocking layer;

forming a touch insulating layer on a side, facing away from the blocking layer, of the first metal layer; and forming a second metal layer on a side, facing away from the first metal layer, of the touch insulating layer, wherein the first metal layer comprises a pattern of a first touch electrode connection part, and the second metal layer comprises a pattern of a first touch electrode, a pattern of a second touch electrode and a pattern of a second touch electrode connection part; and an orthographic projection of the first touch electrode connection part on the base substrate does not overlap with the orthographic projection of the filling layer on the base substrate.

15. The manufacturing method according to claim 4, further comprising:

peeling the flexible substrate from the base substrate; and digging a hole on the to-be-dug area in the display panel.

16. A display panel, comprising:

a flexible substrate, comprising a display area, at least one to-be-dug area surrounded by the display area, and an annular isolation area arranged between the display area and the to-be-dug area;

a driving circuit layer, disposed on the flexible substrate;

an electroluminescent layer, disposed on a side, facing away from the flexible substrate, of the driving circuit layer;

an encapsulation layer, disposed on a side, facing away from the flexible substrate, of the electroluminescent layer;

a filling layer, disposed on a side, facing away from the electroluminescent layer, of the encapsulation layer, wherein the filling layer is in the annular isolation area;

a blocking layer, disposed on a side, facing away from the electroluminescent layer, of the encapsulation layer and a side facing away from the electroluminescent layer, of the filling layer; and a touch functional layer, disposed on a side, facing away from the encapsulation layer, of the blocking layer, wherein a surface of a side, facing away from the flexible substrate, of the filling layer is higher than a surface of a side, facing away from the flexible substrate, of the encapsulation layer in the display area; and the touch functional layer comprises a pattern of a touch electrode, and an orthographic projection of the pattern of the touch electrode on the flexible substrate does not overlap with an orthographic projection of the filling layer on the flexible substrate.

17. The display panel according to claim 16, further comprising:

a protective layer, disposed on a side, facing away from the encapsulation layer, of the touch functional layer and a side facing away from the encapsulation layer, of the blocking layer, wherein the driving circuit layer comprises:

a buffer layer, disposed on the flexible substrate;

an active layer, disposed on a side, facing away from the flexible substrate, of the buffer layer;

a gate insulating layer, disposed on a side, facing away from the flexible substrate, of the active layer and a side, facing away from the flexible substrate, of the buffer layer;

a gate metal layer, disposed on a side, facing away from the active layer, of the gate insulating layer;

an interlayer insulating layer, disposed on a side, facing away from the gate insulating layer, of the gate metal layer;

a source-drain metal layer, disposed on a side, facing away from the gate metal layer, of the interlayer insulating layer; and a planarization layer, disposed on a side, facing away from the interlayer insulating layer, of the source-drain metal layer;

the electroluminescent layer comprises:

a first electrode layer, disposed on a side, facing away from the source-drain metal layer, of the planarization layer, wherein the first electrode layer comprises a plurality of first electrodes;

a pixel defining layer, disposed on a side, facing away from the source-drain metal layer, of the planarization layer, wherein the pixel defining layer located at a spacing position between adjacent first electrodes;

a supporting part, disposed on a side, facing away from the planarization layer, of the pixel defining layer;

a light-emitting layer, disposed on a side, facing away from the planarization layer, of the first electrodes; and a second electrode layer, disposed on a side, facing away from the first electrode layer, of the light-emitting layer and a side, facing away from the first electrode layer, of the pixel defining layer;

the encapsulation layer comprises:

a first inorganic encapsulation layer, disposed on a side, facing away from the light-emitting layer, of the second electrode layer;

an organic encapsulation layer, disposed on a side, facing away from the second electrode layer, of the first inorganic encapsulation layer;

a second inorganic encapsulation layer, disposed on a side, facing away from the first encapsulation layer, of the organic encapsulation layer, wherein orthographic projections of the first inorganic encapsulation layer and the second inorganic encapsulation layer on the flexible substrate cover the display area and the annular isolation area; and an orthographic projection of the organic encapsulation layer on the flexible substrate is in the display area; and the touch functional layer comprises:

a first metal layer, disposed on a side, facing away from the encapsulation layer, of the blocking layer;

a touch insulating layer, disposed on a side, facing away from the blocking layer, of the first metal layer; and a second metal layer, disposed on a side, facing away from the first metal layer, of the touch insulating layer, wherein the first metal layer comprises a pattern of a first touch electrode connection part, the second metal layer comprises a pattern of a first touch electrode, a pattern of a second touch electrode and a pattern of a second touch electrode connection part, and the first touch electrode connection part is electrically connected with the first touch electrode through a via hole of the touch insulating layer; and an orthographic projection of the pattern of the first touch electrode connection part on the flexible substrate does not overlap with the orthographic projection of the filling layer on the flexible substrate.

18. The display panel according to claim 17, wherein the annular isolation area comprises:

an annular blocking dam, surrounding the to-be-dug area;

at least one first annular isolation part, surrounded by the annular blocking dam; and at least one second annular isolation part, surrounding the annular blocking dam, wherein the annular blocking dam is in a same layer as at least one of the planarization layer, the pixel defining layer or a supporting post.

19. The display panel according to claim 18, wherein the organic encapsulation layer covers second annular isolation part and a side wall of a side, facing the display area, of the annular blocking dam;

the orthographic projection of the filling layer on the flexible substrate has an overlap area with the orthographic projection of the organic encapsulation layer on the flexible substrate;

the filling layer covers the annular blocking dam, and an edge close to the display area, of the filling layer does not exceed an edge closest to the display area, of the second annular isolation part;

the first annular isolation part and the second annular isolation part are both annular isolation spacers; and the annular isolation spacer and the source-drain metal layer are disposed on a same layer; and the first annular isolation part and the second annular isolation part are both annular isolation grooves; and the annular isolation grooves penetrate through the buffer layer, the gate insulating layer and the interlayer insulating layer, to form the annular isolation grooves on the flexible substrate.

20. A display apparatus, comprising the display panel according to claim 16.

* * * * *